United States Patent
Takahashi (10) Patent No.: US 10,957,266 B2
(45) Date of Patent: Mar. 23, 2021

(54) DRIVE CIRCUIT AND DISPLAY APPARATUS

(71) Applicant: SAKAI DISPLAY PRODUCTS CORPORATION, Sakai (JP)

(72) Inventor: Yoshihisa Takahashi, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/336,043

(22) PCT Filed: Sep. 26, 2016

(86) PCT No.: PCT/JP2016/078285
§ 371 (c)(1),
(2) Date: Jun. 11, 2019

(87) PCT Pub. No.: WO2018/055769
PCT Pub. Date: Mar. 29, 2018

(65) Prior Publication Data
US 2019/0311689 A1    Oct. 10, 2019

(51) Int. Cl.
*G09G 3/36* (2006.01)
*G11C 19/28* (2006.01)
*G09G 3/20* (2006.01)

(52) U.S. Cl.
CPC ............. *G09G 3/3648* (2013.01); *G09G 3/20* (2013.01); *G09G 3/36* (2013.01); *G11C 19/287* (2013.01);
(Continued)

(58) Field of Classification Search
CPC .......... G09G 3/20; G09G 3/36; G09G 3/3648; G09G 3/3677; G09G 2310/0286;
(Continued)

(56) References Cited

U.S. PATENT DOCUMENTS

2003/0117566 A1*  6/2003  Park ................... G09G 3/3677
                                                           349/149
2006/0262074 A1   11/2006  Shimoda
(Continued)

FOREIGN PATENT DOCUMENTS

CN      101779227 A      7/2010
JP      2000-293143 A    10/2000
(Continued)

OTHER PUBLICATIONS

International Search Report dated Dec. 20, 2016 for International application No. PCT/JP2016/078285.

*Primary Examiner* — Mihir K Rayan
(74) *Attorney, Agent, or Firm* — ScienBiziP, P.C.

(57) ABSTRACT

Provided are a drive circuit and a display apparatus capable of making the waveforms of driving signals uniform. The drive circuit comprises a plurality of shift registers each comprising an input end, an output end, and a switching element connected between the input end and the output end. The input ends are respectively connected to a plurality of branch points on an input-signal line arranged on a display panel. The output ends are respectively connected to a plurality of output-signal lines. The drive circuit outputs a driving signal from the output end, on the basis of a signal input through the input end. All or some of the shift registers differ, according to a position of the branch point to which the input end is connected, in resistance value between the input end and the output end while the switching element is ON.

9 Claims, 5 Drawing Sheets

(52) U.S. Cl.
CPC . *G09G 2310/0286* (2013.01); *G09G 2310/08* (2013.01)

(58) Field of Classification Search
CPC ....... G09G 2310/08; G09G 2320/0223; G11C 19/28; G11C 19/287
See application file for complete search history.

(56) References Cited

U.S. PATENT DOCUMENTS

| | | | |
|---|---|---|---|
| 2009/0033817 A1* | 2/2009 | Ooida | G02F 1/1368 349/43 |
| 2010/0141570 A1 | 6/2010 | Horiuchi et al. | |
| 2012/0249502 A1 | 10/2012 | Takahashi et al. | |
| 2015/0161959 A1* | 6/2015 | Hsu | G09G 3/3677 345/204 |
| 2018/0284551 A1* | 10/2018 | Shim | G09G 3/3677 |
| 2019/0311689 A1* | 10/2019 | Takahashi | G09G 3/20 |

FOREIGN PATENT DOCUMENTS

| | | |
|---|---|---|
| JP | 2006-351165 A | 12/2006 |
| JP | 2008-058634 A | 3/2008 |
| JP | 5132818 B2 | 1/2013 |

\* cited by examiner

| Shift Register | SR1 | SR2 | ... | SRi |
|---|---|---|---|---|
| Channel Width of Thin-film Transistor M1 | W1 | W2 | ... | Wi |

$W1 \leq W2 \leq \cdots \leq Wi$

FIG. 8

| Shift Register | SR1 | SR2 | ... | SRi |
|---|---|---|---|---|
| Channel Length of Thin-film Transistor M1 | L1 | L2 | ... | Li |

$L1 \geq L2 \geq \cdots \geq Li$

| Shift Register | SR1 | SR2 | ... | SRi |
|---|---|---|---|---|
| Series resistance | r1 | r2 | ... | ri |

$r1 \geq r2 \geq \cdots \geq ri$

DRIVE CIRCUIT AND DISPLAY APPARATUS

TECHNICAL FIELD

The present invention relates to a drive circuit and a display apparatus.

BACKGROUND ART

In recent years, liquid crystal display (LCD), which typifies flat panel displays, have been widely used not only in the field of small or medium-sized panel, but also in the field of large panel, such as for TV. Active-matrix type liquid crystal display apparatus is widely used in such liquid crystal display.

A display panel of an active matrix liquid crystal display apparatus includes a plurality of source bus lines (video signal lines), plurality of gate bus lines, pixel-foraging units, and others. The pixel-forming units are provided at portions where the plurality of source bus lines and the plurality of gate bus lines are crossed, thereby arranged in a matrix. Each pixel-forming unit comprises a thin film transistor, a pixel capacitor for holding pixel voltage value, and the like. A gate terminal of the thin film transistor is connected to a gate bus line that passes a portion where the gate bus line and a source bus line cross. Also, a source terminal of the thin film transistor is connected to the source bus line passing through that portion. Also, an active matrix liquid crystal display apparatus comprises a gate driver for driving the gate bus lines, a source driver for driving the source bus lines, and the like.

One source bus line is not possible to simultaneously transfer video signals representing pixel voltage values for multiple rows. Therefore, writing (charging) of video signals to pixel capacitors in pixel-forming units arranged in a matrix needs to be performed sequentially for one row at a time. Thus, the gate driver (a drive circuit) has a configuration in which more than one shift registers are connected to each other so that multiple gate bus lines are sequentially selected for a predetermined period. The gate driver, based on a plurality of clock signals, outputs a drive signal sequentially from shift registers in each row to each gate bus line (see Patent Document 1).

PRIOR ART DOCUMENT

Patent Document

Patent Document 1: JP 5132818 B

SUMMARY OF THE INVENTION

Problem to be Solved by the Invention

However, in the conventional display apparatus disclosed in Patent Document 1, for example, an input-signal line is arranged along one side of the peripheral edge of the display panel, and an input-signal supplying circuit is connected to one end of the arranged input-signal line, and supplies input signal including clock signal to each shift register in the gate driver through the input-signal line. In addition, with an increase in the size of the display panel, wiring length of the input-signal line increases, resistances (impedances) from the input-signal supplying circuit (from one end of the input-signal line) to each shift register (for example, a shift register in an anterior stage which is near to the one end of the input-signal line or the shift register in a posterior stage which is far from the one end of the input-signal line) differ, and the degrees of delay of the driving signals output from the shift registers in the respective stages also differ. Therefore, waveforms of the driving signals become different, and the difference may cause defects such as display unevenness.

The present invention has been made in view of such circumstances, and an object of the present invention is to provide a drive circuit which can make waveforms of the driving signals uniform, and a display apparatus which comprises the drive circuit.

Means to Solve the Problem

A drive circuit according to an embodiment of the present invention comprises a plurality of shift registers each comprising an input end, an output end, and a switching element connected between the input end and the output end, where the input ends of the shift registers are respectively connected to a plurality of branch points on an input-signal line arranged on a display panel, output ends of the shift registers are respectively connected to a plurality of output-signal lines arranged on the display panel, and the drive circuit outputs a driving signal from the output end on the basis of a signal input through the input end of each of the shift registers, wherein all or some of the shift registers differ, according to a position of the branch point to which the input end is connected, in resistance value between the input end and the output end while the switching element is ON.

A display apparatus according to an embodiment of the present invention comprises a drive circuit according to an embodiment of the present invention.

Effect of the Invention

According to the present invention, it is possible to make the waveforms of the driving signals uniform.

EMBODIMENTS FOR CARRYING OUT THE INVENTION

Figure 1:
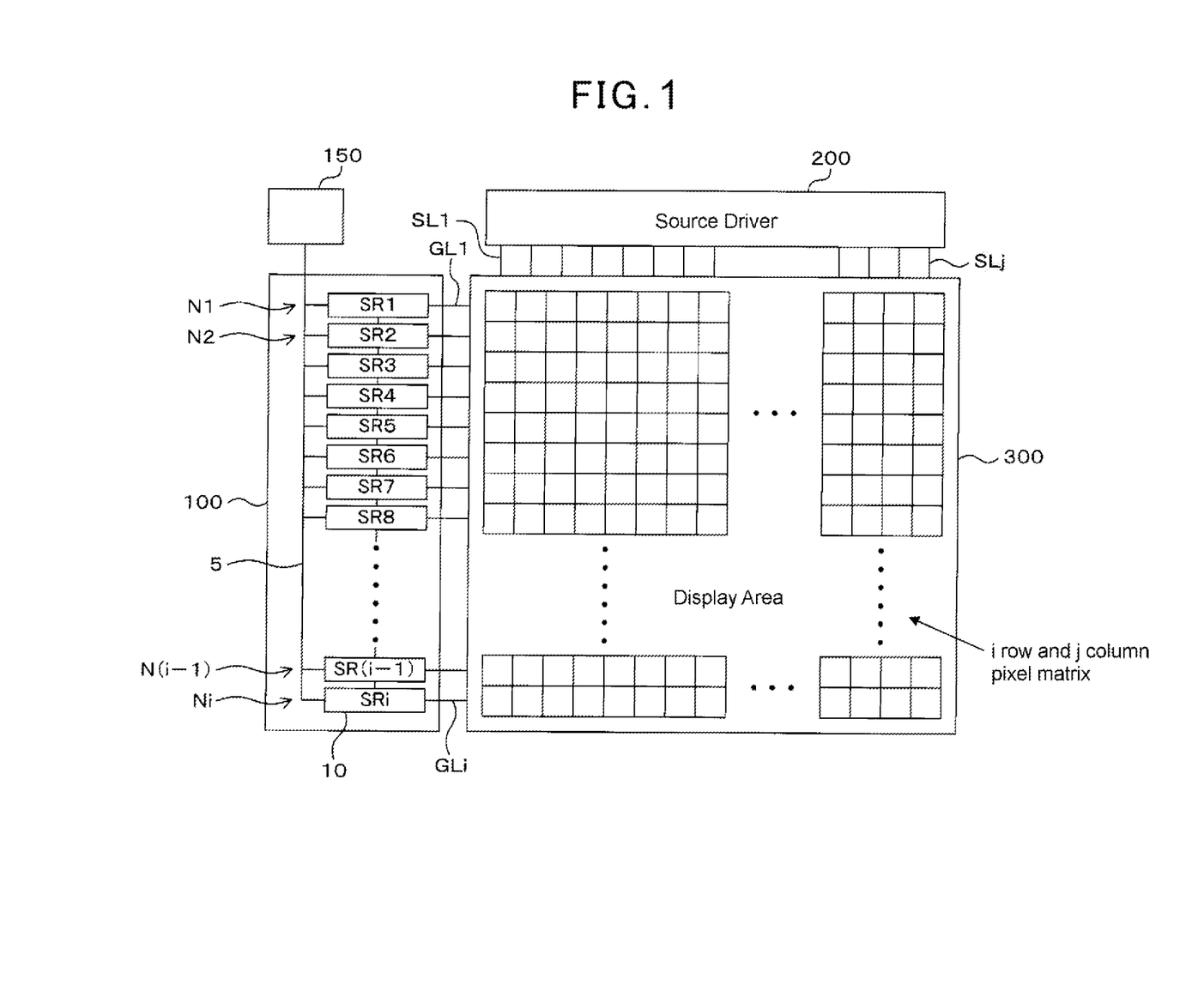
FIG. 1 schematically shows an example of main portions of a display apparatus comprising a drive circuit according to the present embodiment.

Next, an embodiment of the present invention is explained with reference to the drawings. FIG. 1 schematically shows an example of main portions of a display apparatus comprising a drive circuit according to the present embodiment. The display apparatus according to the present embodiment is, for example, an active-matrix type liquid-crystal display apparatus. As shown in FIG. 1, the display apparatus comprises a gate driver (also referred to as a scan-signal-line drive circuit) 100 as a drive circuit, an input-signal generating circuit 150, a source driver (also referred to as a video-signal-line drive circuit) 200, a display area 300, and other elements. The gate driver 100 is formed on a display panel using, for example, amorphous silicon, polycrystalline silicon, microcrystalline silicon, an oxide semiconductor, or other materials. Specifically, the gate driver 100 is formed on a light-transmitting pixel substrate (also referred to as an active-matrix substrate or a cell-array substrate).

A plurality (j lines in the example of FIG. 1) of source bus lines (video signal lines) SL1 to SLj are connected between the display area 300 on the display panel and the source driver 200. In addition, a plurality (i lines in the example of FIG. 1) of the gate bus lines GL1 to GLi are connected between the display area 300 and the gate driver 100. Pixel-forming units are respectively arranged at the crossing positions of the plurality of source bus lines and the plurality of gate bus lines. The pixel-forming units are arranged into a matrix arrangement, and comprise TFTs (thin-film transistors), pixel capacitances for holding pixel voltage values, and other elements.

The source driver 200 outputs video signals for driving to the respective source bus lines SL1 to SLj on the basis of signals such as a digital video signal, a source-start-pulse signal, and a source clock signal that are output by a display control circuit (not shown).

The gate driver 100 comprises a plurality of shift registers 10, which are connected to one another.

An input-signal generating circuit (input-signal source) 150 is connected to one end of an input-signal line 5 arranged on the display panel. A plurality of branch points N1, N2, - - - , Ni are arranged on the input-signal line 5 in order of proximity to the input-signal generating circuit 150. The input ends of the shift registers 10 that are indicated by symbols SR1, SR2, - - - , SRi are respectively connected to the branch points N1, N2, - - - , Ni. In FIG. 1, for convenience, multiple input-signal lines are collectively indicated by the single input-signal line 5.

The input-signal generating circuit 150 supplies rectangular wave-like signals (given signals) such as a clock signal, a gate start pulse signal, and a gate end pulse signal through the input-signal line 5 to each shift register 10.

On the basis of the above-described given signals, the gate driver 100 successively outputs driving signals to the respective gate bus lines GL1 to GLi as output signal lines arranged on the display panel. The outputting of the driving signals to the respective gate bus lines GL1 to GLi is repeated for each vertical scanning period.

Figure 2:
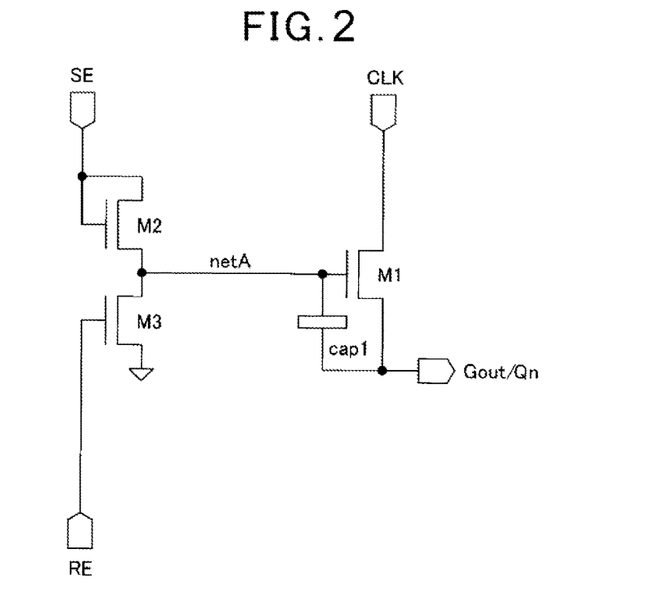
FIG. 2 shows a circuit diagram of an example of a basic configuration of a shift register.
Figure 3:
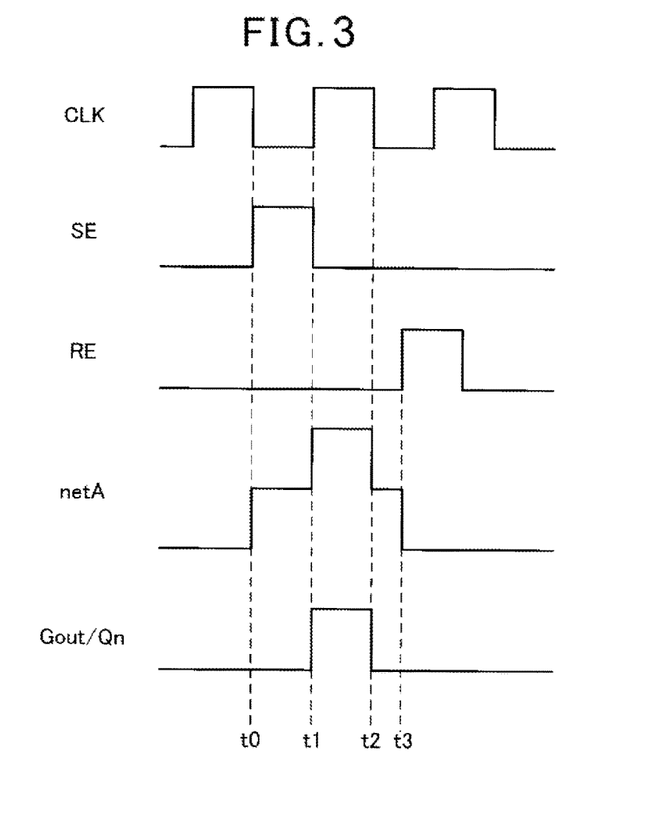
FIG. 3 shows a timing chart indicating an example of an operation of the shift register shown in FIG. 2.

Next, the shift register 10 is explained. FIG. 2 shows a circuit diagram of an example of a basic configuration of the shift register 10, and FIG. 3 shows a timing chart indicating an example of an operation of the shift register 10 shown in FIG. 2. The timing chart indicated in FIG. 3 shows the operation of the shift register 10 exemplified in FIG. 2. As shown in FIG. 2, the shift register 10 comprises thin-film transistors M1 to M3 as three switching elements and a capacitor cap1.

Specifically, in the thin-film transistors M1 included in the shift register 10, a given clock signal CLK is input into the drain, and a driving signal is output from the source to an output node (Gout/Qn). In the thin-film transistors M2 included in the shift register 10, a given set signal (which is indicated by a symbol SE, and is, for example, an output of a shift register on a side anterior to the shift register in question) is input into the drain, the source is connected to the gate of the thin-film transistor M1, and the gate is connected to the drain. In the thin-film transistors M3 included in the shift register 10, the drain is connected to an output control node (also denoted as netA) to which the source of the thin-film transistor M2 and the gate of the thin-film transistor M1 are connected, a given electric potential is applied to the source, and a given reset signal (which is indicated by a symbol RE, and is, for example, an output of a shift register on a side posterior to the shift register in question) is input to the gate. In addition, the capacitor cap1 is connected between the gate and the source of the thin-film transistor M1. In FIG. 2, the terminal to which the clock signal CLK is input is referred to as an input end of the shift register 10, and the output node (Gout/Qn) is referred to as an output end of the shift register 10.

As shown in FIG. 3, when the set signal SE is input at time t0, the thin-film transistor M2 is turned on, and the capacitor cap1 is charged (pre-charge). Thereby, the electric potential of the output control node (netA) changes from low level to high level, and the thin-film transistor M1 is turned on. However, since the clock signal CLK is low level in the period from time t0 to t1 (also referred to as a set period), the electric potential of the output node (Gout/Qn) is maintained in low level.

At time t1, the set signal SE changes from high level to low level. Since the reset signal RE is low, the thin-film transistor M3 is in an off state. Therefore, the output control node (netA) is brought to a floating state. In addition, when the clock signal CLK changes from low level to high level at time t1 the electric potential of the output control node (netA) rises with a rise of the electric potential of the drain of the thin-film transistor M1 (netA receives a bootstrap) because the electric charge which has been charged in the capacitor cap1 maintains the difference in the electric potential between the output control node (netA) and the output node (Gout/Qn). As a result, the thin-film transistor M1 is turned on, and the electric potential of the output node (Gout/On) rises. The period from the time t1 to time t2 described later is also referred to as a selection period.

At the time t2, the clock signal CLK changes from high level to low level. Since the thin-film transistor M1 is on at the time t2, the electric potential of the output node (Gout/Qn) falls with a fall of the electric potential of the drain of the thin-film transistor M1. In addition, the electric potential of the output control node (netA) also falls with the fall of the electric potential of the output node (Gout/Qn).

At time t3, once the reset signal RE changes from low level to high level, the thin-film transistor M3 is turned on, and the electric potential of the output control node (netA) falls to low level. The period in which the reset signal RE is in a high level is also referred to as a reset period.

Next, a signal delay in the gate driver 100 is explained by taking the clock signal being the given signal as an example. First, an example of a case to which the present embodiment is not applied is explained as a comparative example.

Figure 4:
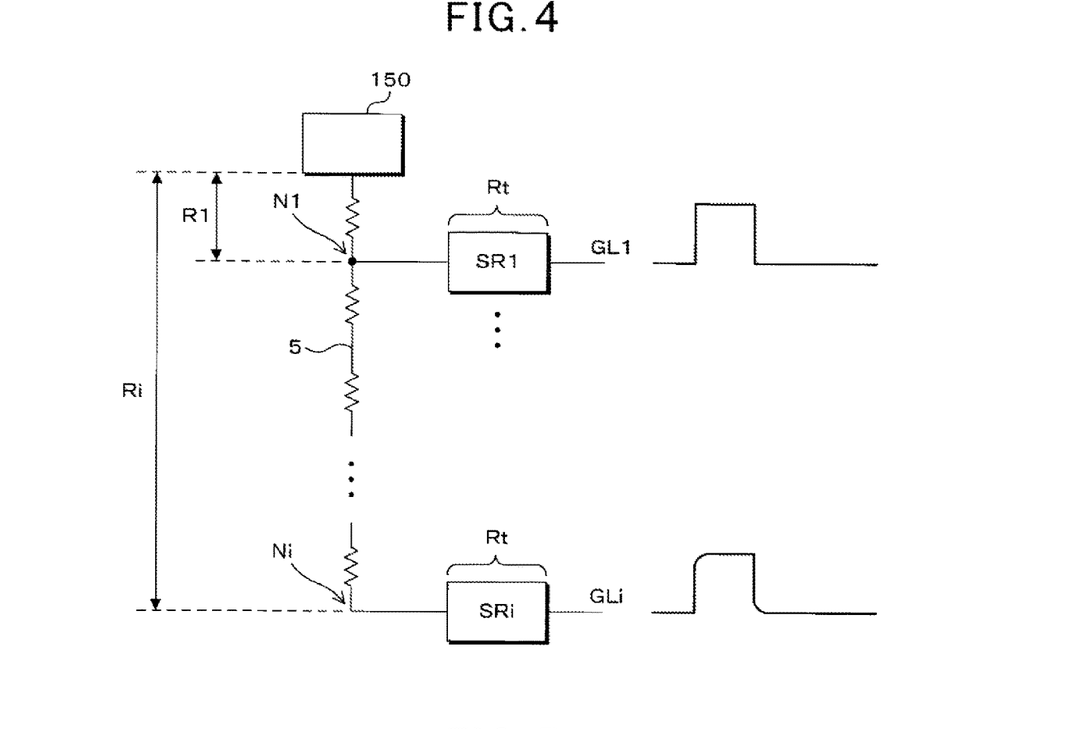
FIG. 4 schematically shows an example of a signal delay in a gate driver as a comparative example.

FIG. 4 schematically shows an example of a signal delay in the gate driver 100 as a comparative example. The input-signal generating circuit 150 is connected to one end of the input-signal line 5 arranged on the display panel. A plurality of branch points N1, N2, - - -, Ni are arranged on the input-signal line 5 in order of proximity to the input-signal generating circuit 150. The input ends of the shift registers 10 indicated by SR1, SR2, - - -, SRi are respectively connected to the branch points N1, N2, - - -, Ni. In FIG. 4, for convenience, the shift register SR1 in the first stage and the shift register SRi in the final stage are shown.

The resistance component (resistance value) of the input-signal line 5 in the path from the output side of the input-signal generating circuit 150 to the branch point N1 is denoted by R1, and the resistance component (resistance value) of the input-signal line 5 in the path from the output side of the input-signal generating circuit 150 to the branch point Ni is denoted by Ri (where Ri>R1). Although not shown, as well as the resistance components (the resistance components of the input-signal line 5 by themselves), the capacitance components (parasitic capacitances or stray capacitances) are distributed over the input-signal line 5 arranged on the display panel. In addition, the resistance value between the input and output ends of the shift registers SR1 and SRi is denoted by Rt. The resistance value Rt can be, for example, the conduction resistance (on-resistance) in the state in which conduction is made between the source and the drain in the thin-film transistor M1 in the shift register.

As described above, the rising time and the falling time of the given signals on the input-signal line 5 become long or short according to the magnitude of the resistance component and the capacitance component in the input-signal line 5. For example, as shown in FIG. 4, the resistance component (R1 in the example of FIG. 4) and the capacitance component (not shown) between the output side of the input-signal generating circuit 150 and the branch point (for example, the branch point N1) near to the input-signal generating circuit 150 are relatively small. Therefore, the rising time and the falling time of the driving signal output from the output end of the shift register SR1 to the gate bus line GL1 are short. In the example of FIG. 4, for convenience, the driving signal is shown as rectangular wave that is almost close to ideal.

On the other hand, as shown in FIG. 4, the resistance component (R1 in the example of FIG. 4) and the capacitance component (not shown) between the output side of the input-signal generating circuit 150 and a branch point (for example, the branch point Ni) far from the input-signal generating circuit 150 are relatively large. Therefore, the rising time and the falling time of the driving signal output from the output end of the shift register SRi to the gate bus line GLi are long. In this way, in the case of a comparative example shown in FIG. 4, the degrees of delay of the driving signals each output from the shift register in each stage are different. Therefore, the waveforms of the driving signals become different, and can cause defects such as display unevenness. The present embodiment is aimed at solving such a problem.

In the present embodiment, all or some of the shift registers 10 in the gate driver 100 differ, according to the position of the branch point to which the input end of the shift register 10 in question is connected, in the resistance value between the input end and the output end while the thin-film transistor 1411 included in the shift resister 10 in question is ON.

For example, the resistance values between the input and output ends of the respective shift registers 10 are set such that they are differentiated. Moreover, some of the shift registers 10 can be identical in the resistance value between the input and output ends.

Figure 5:
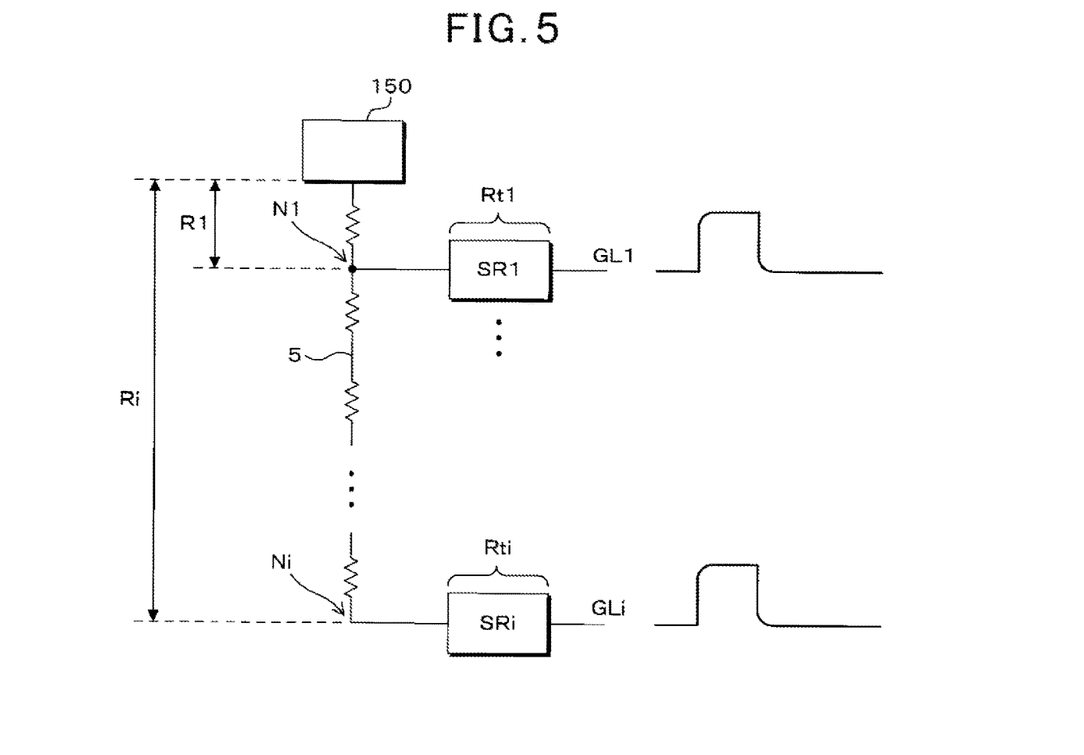
FIG. 5 schematically shows a first example of a signal delay in a gate driver according to the present embodiment.

FIG. 5 schematically shows a first example of the signal delay in the gate driver 100 according to the present embodiment. In the present embodiment, the resistance values between the input end and the output end while the thin-film transistor M1 included in the shift register 10 in question is ON differ according to the position of the branch point to which the input end of the shift register 10 in question is connected. For example, as shown in FIG. 5, the resistance value between the input end and the output end of the shift register SR1 connected to the branch point N1 is denoted by Rt1, and the resistance value between the input end and the output end of the shift register SRi connected to the branch point Ni is denoted by Rti (where Rt1>Rti). Then, the resistance components between the output side of the input-signal generating circuit 150 and the output ends of the shift registers 10 are made identical or equivalent. For example, in the example of FIG. 5, the relational expression (1/R1+1/Rt1)=(1/Ri+1/Rti) is satisfied. In other words, the resistance components between a given one end of the input-signal line 5 (e.g., the side to which the input-signal generating circuit 150 is connected) and the output ends of the shift registers 10 can be made identical or equivalent regardless of the positions of the branch points by increasing the resistance value between the input end and the output end of each shift register 10 by an amount corresponding to the smallness of the resistance component in the input-signal line 5 according to the position of the branch point.

According to the above configuration, the rising time and the falling time of the driving signal that is output from the output end of the shift register SR1 to the gate bus line GL1 are respectively identical or equivalent to the rising time and the falling time of the driving signal that is output from the output end of the shift register SRi to the gate bus line GLi. The term "equivalent" means to be not identical but to be allowed to be regarded as identical (within a tolerable range). According to the present embodiment, it is possible to make the rising times and the falling times of the driving signals identical or equivalent regardless of the positions of the branch points. Therefore, it is possible to make the waveforms of the driving signals uniform, and it is possible to prevent defects such as display unevenness.

Figure 6:
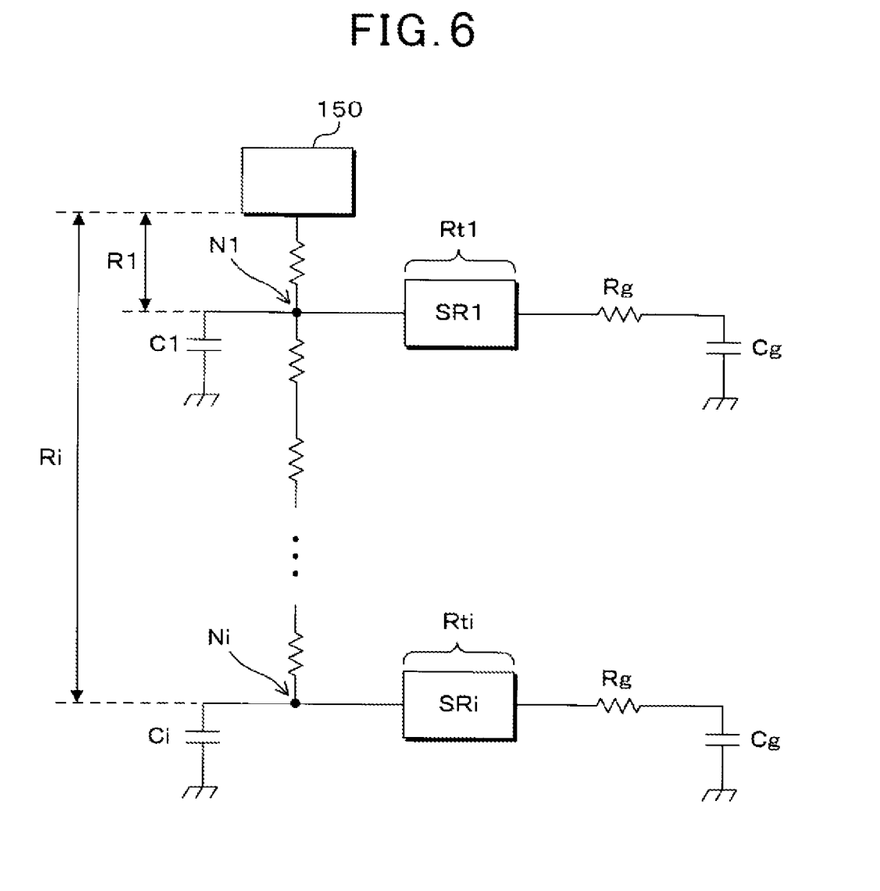
FIG. 6 schematically shows a second example of the signal delay in the gate driver according to the present embodiment.

FIG. 6 schematically shows a second example of the signal delay in the gate driver 100 according to the present embodiment. Since the waveforms of the driving signals from the shift registers SR1 and SRi are also identical in FIG. 6, the waveforms are omitted for convenience. In the example of FIG. 6, the capacitances (parasitic capacitances or stray capacitances) distributed over the input-signal line 5, the resistance components in the gate bus lines as the output signal lines, and the capacitances (parasitic capacitances or stray capacitances) distributed over the gate bus lines are considered in addition to the resistance components in the input-signal line 5 that are shown in FIG. 5. That is, the capacitance components distributed over the input-signal line 5 in the path from the output side of the input-signal generating circuit 150 to the branch point N1 is denoted by and the capacitance components distributed over the input-signal line 5 in the path from the output side of the input-signal generating circuit 150 to the branch point Ni is denoted by Ci. In addition, the resistance component in the gate bus line observed from the output end of each shift register 10 is denoted by Rg, and the capacitance component in the gate bus line observed from the output end of each shift register 10 is denoted by Cg. Although the resistance components or the capacitance components in the gate bus lines observed from the output ends of the shift registers 10 can be different, the resistance components or the capacitance components are assumed to be identical or equivalent in the example of FIG. 6 for convenience.

The rising times and the falling times of the driving signals vary with the resistance components and the capacitance components in the signal lines (the input-signal line 5 and the gate bus lines). The resistance components and the capacitance components in the signal lines can be equivalently expressed, for example, by an RC circuit, and the delays of the signals vary with the time constant of the RC circuit. Specifically, in the example of FIG. 6, the time constant is denoted by τ, and the time constant τ can be expressed by Equation (1). When the part following the ± sign in the denominator is ignored for simplicity, the condition for making the waveform of the driving signal from the shift register SR1 identical or equivalent to the waveform of the driving signal from the shift register SRi can be simply expressed by Equation (2).

$$\tau = \frac{2R_i(R_{ti} + R_g)C_iC_g}{\{R_i(C_i + C_g) + (R_{ti} + R_g)C_g\} \pm \sqrt{\{R_i(C_i + C_g) + (R_{ti} + R_g)C_g\}^2 - 4R_i(R_{ti} + R_g)C_iC_g}} \quad (1)$$

$$\frac{1}{R_1C_1} + \frac{C_1 + C_g}{(R_{ti} + R_g)C_1C_g} = \frac{1}{R_iC_i} + \frac{C_i + C_g}{(R_{ti} + R_g)C_iC_g} \quad (2)$$

$$R_{ti} = \frac{R_1R_i(R_{t1} + R_g)C_1(C_i + C_g)}{R_1R_i(C_1 + C_g)C_i + (R_{t1} + R_g)C_g(R_iC_i - R_1C_1)} - R_g \quad (3)$$

$$\frac{1}{R_1C_1} + \frac{C_1 + C_g}{R_{t1}C_1C_g} = \frac{1}{R_iC_i} + \frac{C_i + C_g}{R_{ti}C_iC_g} \quad (4)$$

$$\frac{1}{R_{ti}} - \frac{1}{R_{t1}} = \frac{1}{R_1} - \frac{1}{R_i} \quad (5)$$

Rti, which is determined from Equation (2), can be expressed as in Equation (3).

When a delay at a point just behind an output of the shift register is considered, the condition can be expressed as Equation (4) by assuming that Rg is zero.

For example, in the case where C1 and Ci are sufficiently smaller than the bus line capacitance Cg and the difference between C1 and Ci is ignorable (C1≈Ci<<Cg) in Equation (4), Equation (4) can be expressed as Equation (5), and the difference (1/Rt1−1/Rti) between the reciprocal number of the resistance value Rt1 between the input and output ends of the shift register SR1 connected to the first branch point N1 and the reciprocal number of the resistance value Rti between the input and output ends of the shift register SRi connected to the i-th branch point Ni can be a value based on (1/Ri−1/R1). Thus, the resistance components between the given one end of the input-signal line 5 (for example, the side to which the input-signal generating circuit 150 is connected) and the output ends of the respective shift registers can be made identical or equivalent regardless of the positions of the branch points.

Although, in this example, the resistance component in the gate bus line observed from the output end of each shift register 10 is denoted by Rg and the capacitance component in the gate bus line observed from the output end of each shift register 10 is denoted by Cg, these are not limiting. For example, the resistance components or capacitance components of the gate bus lines observed from the output ends of the shift registers 10 may not be identical or equivalent, i.e., can be different. For example, in the case where the gate driver 100 comprises a dummy shift register (a shift register in a dummy stage), or in the case where the loads connected to the shift registers are different, or in the case of a charge sharing system comprising the main gate and the sub-gate, or in some other cases, the resistance components or capacitance components of the gate bus lines observed from the output ends of the shift registers 10 can be differentiated. In this way, even in the case where the gate driver 100 comprises a shift register in a dummy stage, or in the case where the loads connected to the shift registers are different, or even in the case of the charge sharing system comprising the main gate and the sub-gate, it is possible to make the waveforms of the driving signals uniform.

Next, it is described how the resistance values between the input and output ends of the respective shift registers 10 are differentiated.

Figure 7:
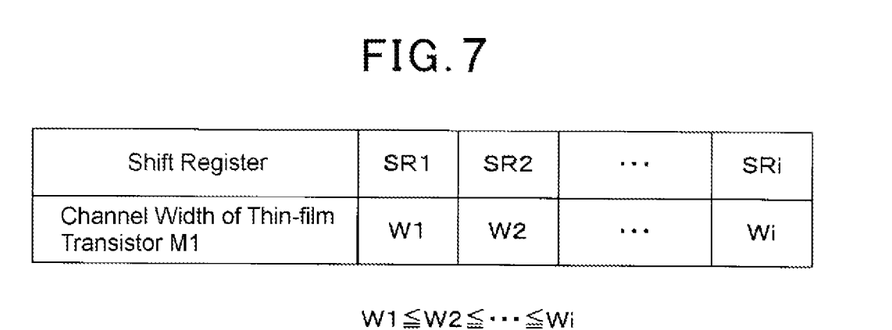
FIG. 7 shows an explanatory diagram of one example of channel widths of thin-film transistors in the shift registers according to the present embodiment.

FIG. 7 shows an explanatory diagram of one example of channel widths of the thin-film transistors M1 in the shift registers 10 according to the present embodiment. The shift registers 10 of which the input ends are respectively connected to the branch points N1, N2, - - - , Ni on the input-signal line 5 are denoted by SR1, SR2, - - - , SRi, and the channel widths of the thin-film transistors M1 in the shift registers SR1, SR2, - - - , SRi are denoted by W1, W2, - - - , Wi. In this case, the channel widths are set so as to satisfy W1≤W2≤ - - - ≤Wi. That is, the nearer to the given one end (for example, the side to which the input-signal generating circuit 150 is connected) the position of the branch point is, the smaller the channel width is set. The on-resistance (the resistance between the drain and the source) of the thin-film transistor M1 can be increased by decreasing the channel width. Thus, it is possible to increase the resistance value between the input and output ends of the shift register 10 by an amount corresponding to the smallness of the resistance component in the input-signal line 5, and it is possible to make the resistance components between the given one end of the input-signal line 5 and the output ends of the respective shift registers 10 identical or equivalent regardless of the positions of the branch points.

Figure 8:
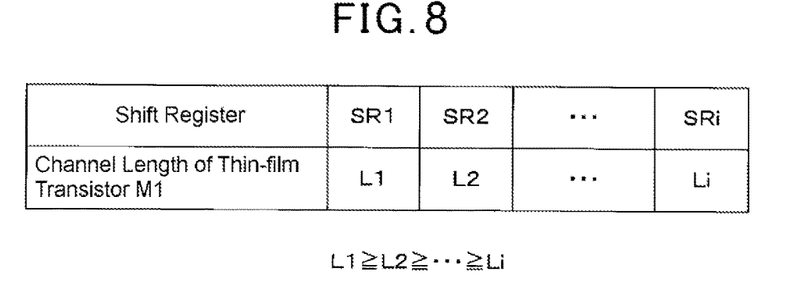
FIG. 8 shows an explanatory diagram of one example of channel lengths of the thin-film transistors in the shift registers according to the present embodiment.

FIG. 8 is an explanatory diagram of one example of channel lengths of the thin-film transistors M1 in the shift registers 10 according to the present embodiment. The shift registers 10 of which the input ends are respectively connected to the branch points N1, N2, - - - , Ni on the input-signal line 5 are denoted by SR1, SR2, - - - , SRi, and the channel lengths of the thin-film transistors M1 in the shift registers SR1, SR2, - - - , SRi are denoted by L1, L2, - - - , Li. In this case, the channel lengths are set so as to satisfy L1≥L2≥ - - - ≥Li. That is, the nearer to the given one end (for example, the side to which the input-signal generating circuit 150 is connected) the position of the branch point is, the greater the channel length is set. The on-resistance (the resistance between the drain and the source) of the thin-film transistor M1 can be increased by increasing the channel length. Thus, it is possible to increase the resistance value between the input and output ends of the shift register 10 by an amount corresponding to the smallness of the resistance component in the input-signal line 5, and it is possible to make the resistance components between the given one end of the input-signal line 5 and the output ends of the respective shift registers 10 identical or equivalent regardless of the positions of the branch points.

Figure 9:
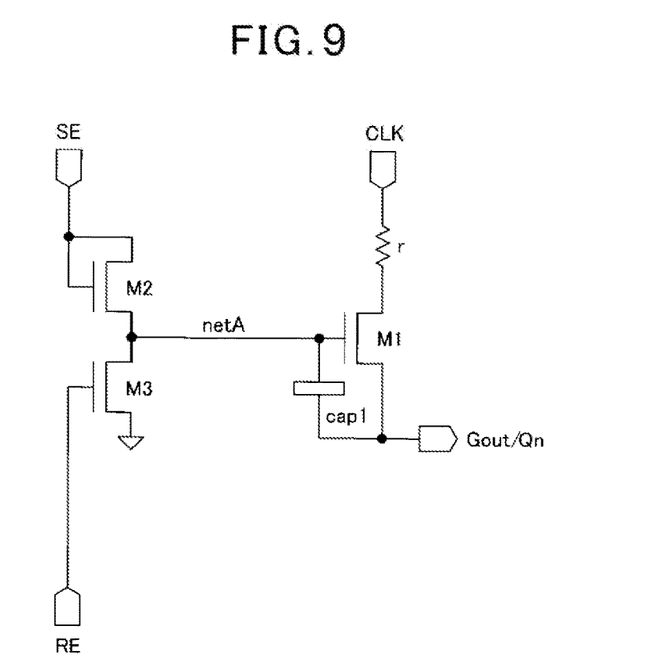
FIG. 9 shows a circuit diagram of another example of a configuration of the shift register according to the present embodiment.
Figure 10:
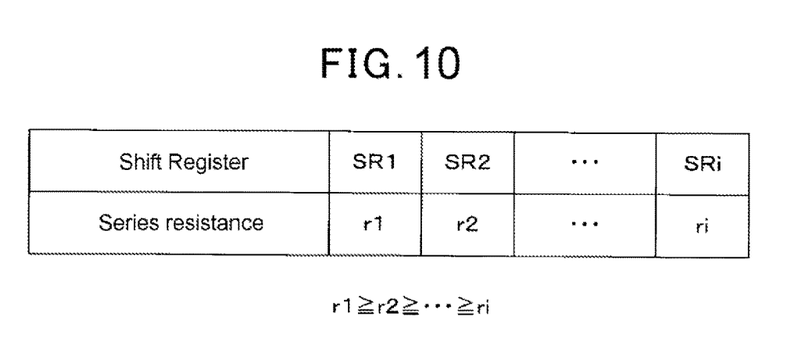
FIG. 10 shows an explanatory diagram of one example of values of resistances connected in series to the thin-film transistors in the shift registers according to the present embodiment.

FIG. 9 shows a circuit diagram of another example of a configuration of the shift register 10 according to the present embodiment, and FIG. 10 shows an explanatory diagram of one example of values of resistances connected in series to thin-film transistors M1 of the shift registers 10 according to the present embodiment. As shown in FIG. 9, a shift register 10 comprises a resistance r connected in series to the thin-film transistor M1 between the input and output ends. All or some of the shift registers 10 can comprise the resistance r. The shift registers 10 of which the input ends are respectively connected to the branch points N1, N2, - - -, Ni on the input-signal line 5 are denoted by SR1, SR2, - - -, SRi, and the resistance values of the resistances r connected in series to the thin-film transistors M1 in the shift registers SR1, SR2, - - -, SRi are denoted by r1, r2, - - -, ri. In this case, the resistance values are set so as to satisfy r1≥r2≥ - - - ≥ri. Therefore, the resistance value between the input and output ends of the shift register 10 can be increased by an amount corresponding to the smallness of the resistance component in the input-signal line 5. Thus, it is possible to make the resistance components between the given one end of the input-signal line 5 and the output ends of the respective shift registers 10 identical or equivalent regardless of the positions of the branch points. In the third example shown in FIG. 9 and FIG. 10, Rt1 in Equation (3), described previously, indicates the sum of the on-resistance of the thin-film transistor M1 and the series resistance r1 in the shift register SR1, and Rti in Equation (3) indicates the sum of the on-resistance of the thin-film transistor M1 and the series resistance ri in the shift register SRi.

The three examples illustrated in FIGS. 7 to 10 can be used singly or in combination.

A drive circuit according to the present embodiment comprises a plurality of shift registers each comprising an input end, an output end, and a switching element connected between the input end and the output end. In the drive circuit, the input ends of the shift registers are respectively connected to a plurality of branch points on an input-signal line arranged on a display panel, and output ends of the shift registers are respectively connected to a plurality of output-signal lines arranged on the display panel. The drive circuit outputs a driving signal from the output end on the basis of a signal input through the input end of each of the shift registers. All or some of the shift registers differ, according to a position of the branch point to which the input end is connected, in resistance value between the input end and the output end while the switching element is ON.

Given signals (for example, rectangular wave signals such as clock signals) are sent out of a given input-signal source to the input-signal line arranged on the display panel. Each shift register outputs the given driving signal from the output end on the basis of the given signal input through the input end connected to the branch point on the input-signal line. Specifically, each shift register outputs, from the output end, the given signal input through the input end as the given driving signal, by turning on the switching element in the shift register in question.

In all or some of the shift registers, the resistance values between the input and output ends, while the switching element which is included in the shift register in question is on, differ according to the position of the branch point to which the input end is connected. For example, the resistance values between the input and output ends can differ in all of the shift registers. And the resistance values between the input and output ends can be identical in some of the shift registers.

The plurality of branch points on the input-signal line are denoted by N1, N2, - - -, Ni in order of proximity to the input-signal source (the signal source which supplies the given signals to the input-signal line), and the shift registers of which the input ends are respectively connected to the branch points N1, N2, - - -, Ni are denoted by SR1, SR2, - - -, SRi. Since the resistance components (the resistance components of the input-signal line by themselves) and the capacitance components (parasitic capacitance or stray capacitance) are distributed over the input-signal line arranged on the display panel, the rising times and the falling times of the given signals on the input-signal line become long or short according to the magnitude of the resistance components and the capacitance components. For example, the resistance components and the capacitance components between the output side of the input-signal source and the branch points near to the input-signal source are relatively small. Therefore, the rising times and the falling times of the driving signal which is output from the output end of the shift register connected to the branch points near to the input-signal source are short. On the other hand, the resistance components and the capacitance components between the output side of the input-signal source and the branch points far from the input-signal source are relatively large. Therefore, the rising times and the falling times of the driving signal which is output from the output end of the shift register connected to the branch point far from the input-signal source are long. Accordingly, the resistance components between the output side of the input-signal source and the output ends of the respective shift registers can be made identical or equivalent, by differentiating the resistance values between the input end and the output end while the switching element included in the shift register in question is on, according to the positions of the branch points to which the input ends of the shift registers are connected. Here, the term "equivalent" means to be not identical but to be allowed to be regarded as equal (within a tolerable range). Thus, it is possible to make the rising times and the falling times of the driving signal identical or equivalent, respectively, regardless of the positions of the branch points, and it is possible to make the waveforms of the driving signals uniform.

In the drive circuit according to the present embodiment, the resistance value is greater when a position of the branch point is nearer to given one end of the input-signal line.

The nearer to the given one end of the input-signal line the position of the branch point is, the greater the resistance value is. The given one end is, for example, an end of the input-signal line to which the input-signal source is connected. The nearer to the given one end of the input-signal line the position of the branch point is, the smaller the resistance component and the capacitance component in the input-signal line are. Therefore, it is possible to make the resistance components between the given one end of the input-signal line and the output ends of the respective shift registers identical or equivalent, regardless of the positions of the branch points, by increasing the resistance value between the input and output ends of the shift register by an amount corresponding to the smallness of the resistance component in the input-signal line.

In the drive circuit according to the present embodiment, the switching element is a thin-film transistor, and a channel width of the thin-film transistor is smaller when the position of the branch point is nearer to the one end.

The switching element is a thin-film transistor, and the nearer to the given one end of the input-signal line the position of the branch point is, the smaller the channel width of the thin-film transistor is. The on-resistance (e.g., the resistance between the drain and the source) of the thin-film transistor can be increased by reducing the channel width.

Therefore, it is possible to increase the resistance value between the input and output ends of the shift register by an amount corresponding to the smallness of the resistance component in the input-signal line, and it is possible to make the resistance components between the given one end of the input-signal line and the output ends of the respective shift registers identical or equivalent regardless of the positions of the branch points.

In the drive circuit according to the present embodiment, the switching element is a thin-film transistor, and a channel length of the thin-film transistor is greater when the position of the branch point is nearer to the one end.

The switching element is a thin-film transistor, and the nearer to the given one end of the input-signal line the position of the branch point is, the greater the channel length of the thin-film transistor is. The on-resistance (e.g., the resistance between the drain and the source) of the thin-film transistor can be increased by increasing the channel length. Therefore, it is possible to increase the resistance value between the input and output ends of the shift register by an amount corresponding to the smallness of the resistance component in the input-signal line, and it is possible to make the resistance components between the given one end of the input-signal line and the output ends of the respective shift registers identical or equivalent regardless of the positions of the branch points.

The drive circuit according to the present embodiment comprises a resistance connected in series to the switching element between the input end and the output end, and a resistance value of the resistance is greater when the position of the branch point is nearer to the one end.

A resistance connected in series to the switching element between the input end and the output end is provided, and the nearer to the given one end of the input-signal line the position of the branch point is, the greater the resistance value of the resistor is. The resistance value between the input and output ends of the shift register can be increased by an amount corresponding to the smallness of the resistance component in the input-signal line, by increasing the resistance connected in series to the switching element instead of, for example, differentiating the on-resistance of the thin-film transistor (e.g., the resistance between the drain and the source). Thus, it is possible to make the resistance components between the given one end of the input-signal line and the output ends of the respective shift registers identical or equivalent regardless of the positions of the branch points.

In the drive circuit according to the present embodiment, in a case where a resistance value of the input-signal line from the one end to a first branch point is denoted by R1, and a resistance value of the input-signal line from the one end to a second branch point is denoted by R2 (where R2>R1), the difference between a reciprocal number of a resistance value between the input end and the output end of a first shift register connected to the first branch point and a reciprocal number of a resistance value between the input end and the output end of a second shift register connected to the second branch point is a value based on (1/R2−1/R1).

In the case where the resistance value of the input-signal line from the given one end to the first branch point is denoted by R1, and the resistance value of the input-signal line from the given one end to the second branch point is denoted by R2 (R2>R1), the difference (1/Rt1−1/Rt2) between the reciprocal number of the resistance value Rt1 between the input and output ends of the first shift register connected to the first branch point and the reciprocal number of the resistance value Rt2 between the input and output ends of the second shift register connected to the second branch point is set at a value based on (1/R2−1/R1). Thus, it is possible to make the resistance components between the given one end of the input-signal line and the output ends of the respective shift registers identical or equivalent regardless of the positions of the branch points.

A display apparatus according to the present embodiment comprises a drive circuit according to the present embodiment.

It is possible to realize a display apparatus which can make the waveforms of the driving signals uniform.

DESCRIPTION OF REFERENCE NUMERAL

5 Input-signal line
10 Shift register
100 Gate driver
150 Input-signal generating circuit
200 Source driver
300 Display area
M1 to M3 Thin-film transistor

The invention claimed is:

1. A drive circuit comprising a plurality of shift registers each comprising an input end, an output end, and a switching element connected between the input end and the output end, where the input ends of the shift registers are respectively connected to a plurality of branch points on an input-signal line arranged on a display panel, output ends of the shift registers are respectively connected to a plurality of output-signal lines arranged on the display panel, and the drive circuit outputs a driving signal from the output end on the basis of a signal input through the input end of each of the shift registers, wherein
   all or some of the shift registers differ in a first resistance value that is a resistance value between the input end and the output end while the switching element is ON, and
   the first resistance value of each of the all or some of the shift registers is determined based on nearness between one end of the input-signal line and the branch point to which each of the all or some of the shift registers is connected.

2. The drive circuit according to claim 1, wherein the first resistance value is greater when a position of the branch point is nearer to the one end of the input-signal line.

3. The drive circuit according to claim 2, wherein the switching element is a thin-film transistor, and a channel width of the thin-film transistor is smaller when the position of the branch point is nearer to the one end.

4. The drive circuit according to claim 2, wherein the switching element is a thin-film transistor, and a channel length of the thin-film transistor is greater when the position of the branch point is nearer to the one end.

5. The drive circuit according to claim 2, comprising a resistor connected in series to the switching element between the input end and the output end, wherein a second resistance value that is a resistance value of the resistor is greater when the position of the branch point is nearer to the one end.

6. The drive circuit according to claim 2, wherein,
   the input-signal line has a third resistance value for each of the branch points, the third resistance value being a resistance value from the one end to each of the branch points, and
   in a case where the third resistance value for a first branch point is denoted by R1; the third resistance value for a second branch point is denoted by R2 (where R2>R1);

the first resistance value of a first shift register connected to the first branch point is denoted by Rt1; and the first resistance value of a second shift register connected to the second branch point is denoted by Rt2, the difference between a reciprocal number of Rt1 and a reciprocal number of Rt2 (1/Rt1−1/Rt2) is a value based on (1/R2−1/R1).

7. A display apparatus comprising the drive circuit according to claim 1.

8. The drive circuit according to claim 1, wherein the first resistance value of each of the all or some of the shift registers is determined such that fourth resistance values between the one end of the input-signal line and the output ends of the all or some of the shift registers are identical or equivalent.

9. The drive circuit according to claim 1, wherein the first resistance value of each of the all or some of the shift registers is determined such that fourth resistance values between the one end of the input-signal line and the output ends of all of the shift registers are identical or equivalent.

* * * * *